US006977196B1

(12) United States Patent
Crenshaw et al.

(10) Patent No.: US 6,977,196 B1
(45) Date of Patent: Dec. 20, 2005

(54) MICRO-ELECTROMECHANICAL SWITCH FABRICATED BY SIMULTANEOUS FORMATION OF A RESISTOR AND BOTTOM ELECTRODE

(75) Inventors: Darius L. Crenshaw, Allen, TX (US); Stuart M. Jacobsen, Frisco, TX (US); David J. Seymour, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/642,969

(22) Filed: Aug. 18, 2003

Related U.S. Application Data

(62) Division of application No. 09/941,031, filed on Aug. 26, 2001, now Pat. No. 6,698,082.

(51) Int. Cl.[7] ................. H01L 21/8234; H01L 21/8244
(52) U.S. Cl. ....................................... 438/238; 438/381
(58) Field of Search ................................ 438/381, 382, 438/384, 385, 238, 329, 330, 704, 706, 745, 438/171, 190, 210

(56) References Cited

U.S. PATENT DOCUMENTS 5,025,346 A * 6/1991 Tang et al. .............. 361/283.1
5,407,841 A * 4/1995 Liao et al. .................. 438/238
5,420,063 A * 5/1995 Maghsoudnia et al. ..... 438/330
5,547,896 A * 8/1996 Linn et al. .................. 438/384
5,573,679 A * 11/1996 Mitchell et al. ............... 216/2
6,326,256 B1 * 12/2001 Bailey et al. ............... 438/238
6,698,082 B2 * 3/2004 Crenshaw et al. ............ 29/593

* cited by examiner

*Primary Examiner*—David Nhu
(74) *Attorney, Agent, or Firm*—W. Daniel Swayze, Jr.; W. James Brady; Frederick J. Telecky, Jr.

(57) ABSTRACT

The present invention provides a method and product-by-method of integrating a bias resistor in circuit with a bottom electrode of a micro-electromechanical switch on a silicon substrate. The resistor and bottom electrode are formed simultaneously by first sequentially depositing a layer of a resistor material (320), a hard mask material (330) and a metal material (340) on a silicon substrate forming a stack. The bottom electrode and resistor lengths are subsequently patterned and etched (350) followed by a second etching (360) process to remove the hard mask and metal materials from the defined resistor length. Finally, in a preferred embodiment, the bottom electrode and resistor structure is encapsulated with a layer of dielectric which is patterned and etched (370) to correspond to the defined bottom electrode and resistor.

9 Claims, 4 Drawing Sheets

MICRO-ELECTROMECHANICAL SWITCH FABRICATED BY SIMULTANEOUS FORMATION OF A RESISTOR AND BOTTOM ELECTRODE

This application is a DIV. of Ser. No. 09/941,031 filed on Aug. 26, 2001, U.S. Pat. No. 6,098,082.

BACKGROUND OF THE INVENTION

1. Technical Field of the Invention

The present invention relates generally to the field of micro-electromechanical switches, and, more particularly, to an apparatus and method of forming resistors and switch-capacitor bottom electrodes.

2. Description of Related Art

Rapid advances made in the field of telecommunications have been paced by improvements in the electronic devices and systems which make the transfer of information possible. Switches which allow the routing of electronic signals are important components in any communication system. Electrical switches are widely used in microwave circuits for many communication applications such as impedance matching, adjustable gain amplifiers, and signal routing and transmission. Current technology generally relies on solid state switches, including MESFETs and PIN diodes. Switches which perform well at high frequencies are particularly valuable. The PIN diode is a popular RF switch, however, this device typically suffers from high power consumption (the diode must be forward biased to provide carriers for the low impedance state), high cost, nonlinearity, low breakdown voltages, and large insertion loss at high frequencies.

The technology of micro-machining enables the fabrication of intricate three-dimensional structures with the accuracy and repeatability inherent to integrated circuit fabrication offering an alternative to semiconductor electronic components. Micro-mechanical switches offer advantages over conventional transistors because they function more like mechanical switches, but without the bulk and high costs. These new structures allow the design and functionality of integrated circuits to expand in a new dimension, creating an emerging technology with applications in a broad spectrum of technical fields.

Recently, micro-electromechanical (MEM) switches have been developed which provide a method of switching RF signals with low insertion loss, good isolation, high power handling, and low switching and static power requirements. Systems use single MEM switches or arrays of switches for functions such as beam steering in a phased array radar for example. The switches switch a high frequency signal by deflecting a movable element (conductor or dielectric) into or out of a signal path to open or close either capacitive or ohmic connections. An excellent example of such a device is the drumhead capacitive switch structure which is fully described in U.S. Pat. No. 5,619,061. In brief, an input RF signal comes into the structure through one of two electrodes (bottom electrode or membrane electrode) and is transmitted to the other electrode when the membrane is in contact with a dielectric covering the bottom electrode.

MEM devices can also be integrated with other control circuitry to operate well in the microwave regime. For example, to operate as a single-pole double-throw switch (SPDT) for directing signals of power flow between other components in a microwave system, the MEM switch is placed in circuit with passive components (resistors, capacitors, and inductors) and at least one other switch. However a problem exist when this type circuit integration is attempted to be realized in silicon because of the diverse temperature processes of MEM components (such as the electrodes) and passive components (such as bias resistors). Therefore, there exist a need for a method of efficiently fabricating a micro-electromechanical switch by simultaneous formation of component resistors and switch electrodes.

SUMMARY OF THE INVENTION

The present invention achieves technical advantages as a method and product-by-method of integrating a resistor in circuit with a bottom electrode of a micro-electromechanical switch on a substrate. The method includes depositing a uniform layer of a resistor material over at least one side of the substrate, depositing a uniform layer of a hard mask material over the resistor material, and depositing a uniform layer of a metal material over the hard mask material forming a stack. Following the depositing acts, a bottom electrode and resistor length are patterned and etched from the deposited stack. In a second etching, the hard mask and metal materials are etched from the pattern resistor length in which the hard mask and metal materials remain substantially covering the pattern bottom electrode. Further, in a preferred embodiment, the bottom electrode and resistor structure is encapsulated with a deposited layer of dielectric which is subsequently patterned and etched to correspond to the structure.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

The numerous innovative teachings of the present applications will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Figure 1:
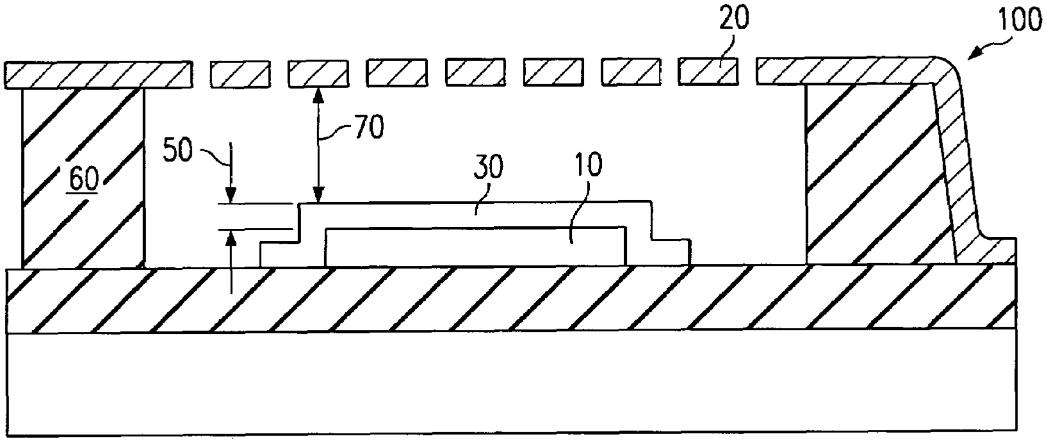
FIG. 1 illustrates a drumhead capacitive micro-electromechanical switch.

Currently used MEM switches were developed with improved electrical characteristics in the RF regime. An excellent example of such a device is the drumhead capacitive switch 100 illustrated in FIG. 1. The details of the MEM switch are set forth in U.S. Pat. No. 5,619,061, the disclosure of which is incorporated herein by reference. In brief, an input RF signal enters into the structure through one of the electrodes (bottom electrode 10 or membrane electrode 20) and is transmitted to the other electrode when the movable membrane electrode 20 is in contact with a dielectric 30 covering the bottom electrode 10.

The membrane electrode 20 is movable through the application of a DC electrostatic field and is suspended across an insulating spacer 60. The insulating spacer 60 can be made of various materials such as photo-resist, PMMA, etc., or can be conductive in other embodiments. Application of a DC potential between the membrane electrode 20 and the bottom electrode 10 causes the movable membrane to deflect downwards due to the electrostatic attraction between the electrodes.

In the on position (membrane 20 down), the membrane electrode 20 is electrostatically deflected to rest atop the dielectric 30, and is capacitively coupled to the bottom electrode 10 with an on capacitance given by $C_{on} \approx \epsilon_{die} A / D_{die}$. In this equation, $\epsilon_{die}$ is the dielectric constant of the dielectric which covers the bottom electrode 10 and $D_{die}$ is the thickness 50 of the dielectric. In an "off" (membrane 20 up) position, an "off" capacitance is given by $C_{off} \approx \epsilon_{air} A / D_{air}$. In this equation, A is the cross sectional area of the electrode (i.e. area where metal is on both sides of the air dielectric), $\epsilon_{air}$ is the dielectric constant of air, and $D_{air}$ is defined as the distance 70 between the lower portion of the membrane and the upper portion of the dielectric. The off/on impedance ratio is given by $\epsilon_{die} D_{air} / \epsilon_{air} D_{die}$, and could be large (greater than 100:1) depending on the physical design of the device and the material properties of the insulator. A ratio of 100:1 is more than sufficient for effectively switching microwave signals.

A single MEM switch operates as a single-pole single-throw (SPST) switch. However, switch applications used in microwave systems for directing signals and/or power flow, for example, frequently require a SPDT switch placed in circuit with passive components such as resistors, capacitors and inductors.

Figure 2:
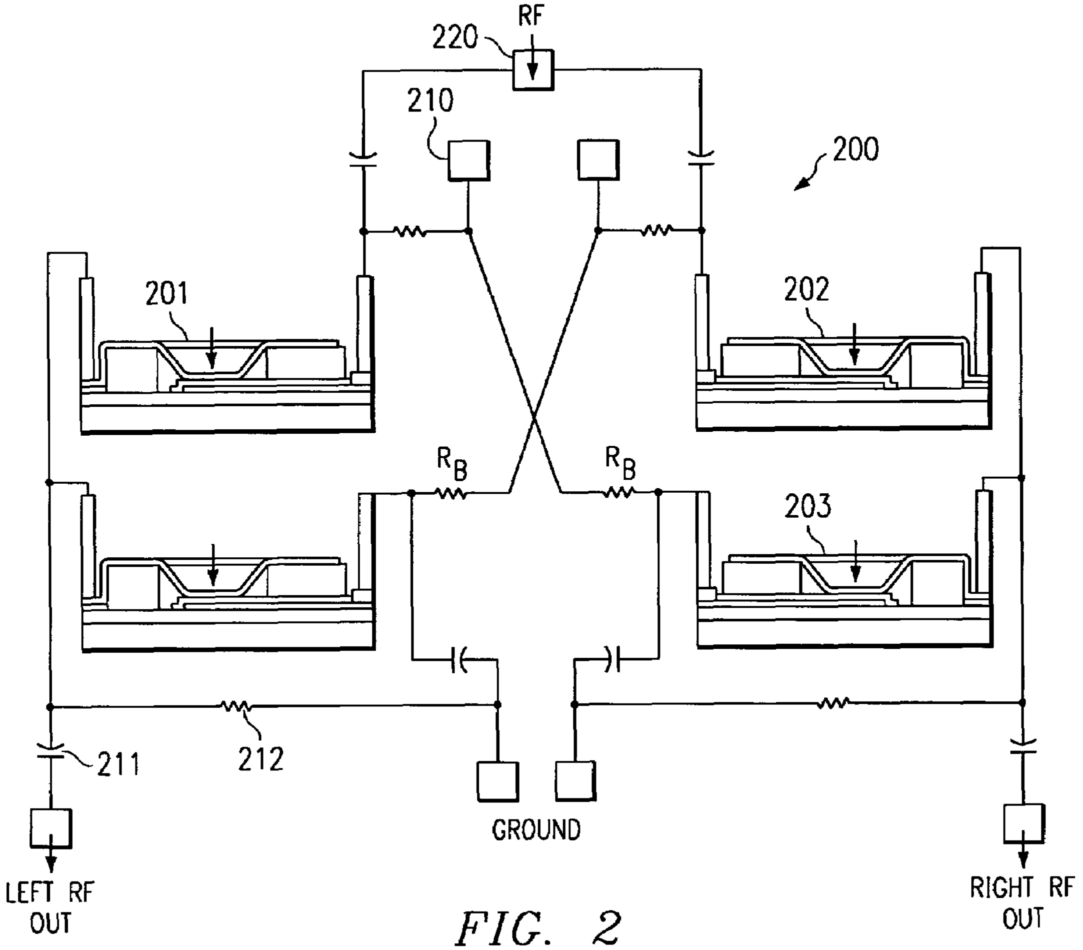
FIG. 2 illustrates a single-pole double-throw series-shunt RF switch configuration.

Referring now to FIG. 2 there is illustrated a single-pole double-throw (SPDT) shunt RF switch 200 which includes multiple MEM switches and passive components. As shown, both resistors and capacitors are required for desired operation. For operation, a switch pull-down voltage is applied to the bias left pad 210 resulting in switch 201 and switch 203 being turned on. An RF signal at the RF input 220 goes through switch 201, through the coupling capacitor 211 and out of Left RF Out. The signal is blocked from going to ground by biased resistor 212, which with a typical 10K ohm resistance, is large in comparison to the typical 50 ohm T-line that Left RF Out is connected to. Any signal that may get through switch 202 is routed through switch 203 to ground, hence assuring that the signal does not go out of Right RF Out. The capacitors in the circuit act to block DC signals. The resistors are required in this circuit in order to aid in the routing of signals and to isolate the DC bias from the RF signal.

However, the above-described SPDT circuit is difficult to realize in silicon because of the fabrication requirements of polysilicon resistors which are routinely used in IC technology. Because polysilicon is a relatively high temperature process (deposited @~620 deg. C.), poly deposition and etch must be done before the MEM device is built. This is certainly mandatory for aluminum-based bottom electrodes. For more effective operation, MEM contacts demand a very smooth surface in order to assure that the contact area between the membrane 20 (when in the down condition) and the primary capacitor dielectric 30 is maximized. The higher temperature, etch and implantation processing required for poly resistor fabrication roughen the underlying oxide on which the bottom electrode metal is deposited. This roughness will be transmitted to the bottom electrode 10 itself, thus, reducing the effective contact area of the electrodes.

The present invention uses thin-film resistors for creating bias resistors, for example, for fabrication with MEM switches to eliminate problems associated with polyresistor fabrication. Consequently, material used for fabrication of the MEM switch bottom electrode and the resistor can be deposited in the same operation. Simultaneous formation of the resistor and bottom electrode also saves the time and expense of at least one mask step. Additionally, the fabrication technique of the present invention is a low temperature process which allows for fabrication of resistors after that of any capacitors, when required.

Figure 3:
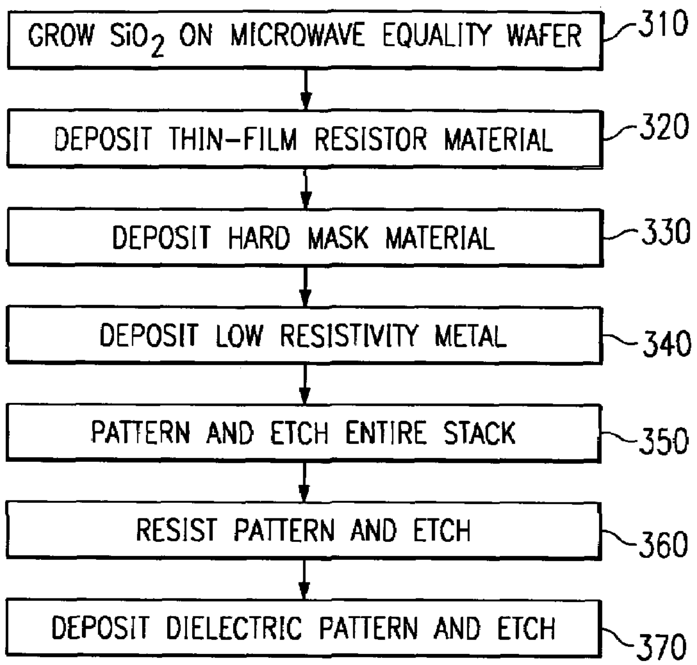
FIG. 3 illustrates a method of fabricating, by simultaneous formation, a resistor and bottom electrode of a micro-electromechanical switch in accordance with the present invention.
Figure 4:
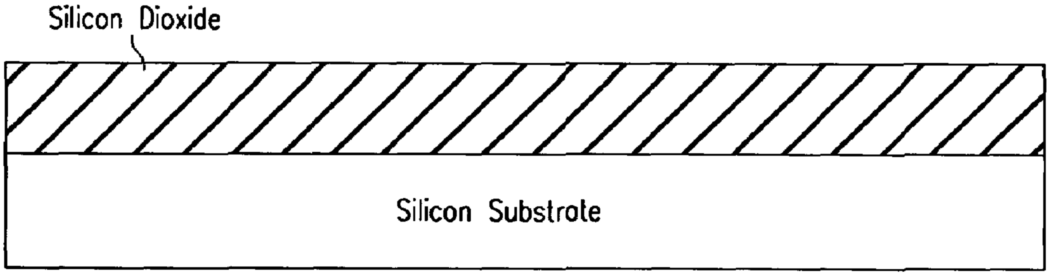
FIG. 4 illustrates growth deposit of silicon dioxide on a microwave quality silicon substrate wafer in accordance with the present invention.

Referring now to FIG. 3 there is illustrated a method of fabricating, by simultaneous formation, a resistor and bottom electrode of a micro-electromechanical switch in accordance with the present invention. In a first step 310, of a preferred embodiment, an anchor material such as $SiO_2$ is grown (or deposited) on a microwave quality wafer or substrate. FIG. 4 illustrates a preferred embodiment of a growth deposit of $SiO_2$ on a silicon substrate, however, the substrate can be made of various materials, for example, silicon on sapphire, gallium arsenide, alumina, glass, silicon on insulator, etc. Formation of the switch on a thick oxide region on a silicon substrate permits control circuitry for control electrodes to be integrated on the same die as the switch. The oxide also helps reduce dielectric losses associate with the silicon substrate.

Referring back to FIG. 3, in a next step 320, a thin-film resistor material is deposited. The details for the fabrication of thin-film resistors using metals such as TaN, SiCr, or NiCr are set forth in U.S. patent application Ser. No. 09/452,691 filed Dec. 2, 1999, Baiely et al., the disclosure of which is incorporated herein by reference. Use of NiCr will be considered here, although any of the other above-mentioned materials can be used. NiCr is used as the thin-film resistor material in the preferred embodiment.

After the thin-film material deposit, a hard mask material, adapted from generally known micro-fabrication techniques is deposited in a subsequent act 330 over the NiCr layer. In a preferred embodiment, approximately 1000 Å of TiW is deposited in deposition act 330.

In a final deposition act 340, a low resistivity metal is deposited. In a preferred embodiment, Al—Si is deposited to a thickness required for optimized RF operation of the switch. Generally, approximately 4000 Å of Al—Si is sufficient. The entire stack of substrate, silicon dioxide, NiCr, TiW and Al—Si will serve as the switch bottom electrode and bias resistor.

Figure 5:
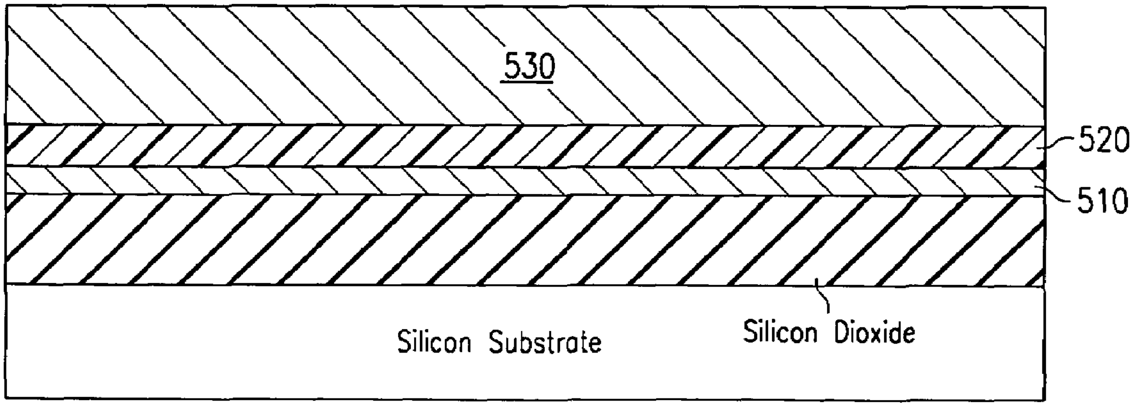
FIG. 5 illustrates a deposited stack of thin-film resistive material, hard mask material and metal on the silicon substrate wafer in accordance with the present invention.

Referring now to FIG. 5 there is illustrated a deposited stack of thin-film resistive material 510, hard mask material 520 and metal 530 on a silicon substrate in accordance with the present invention. In a preferred embodiment, each layer is uniform.

Figure 6B:
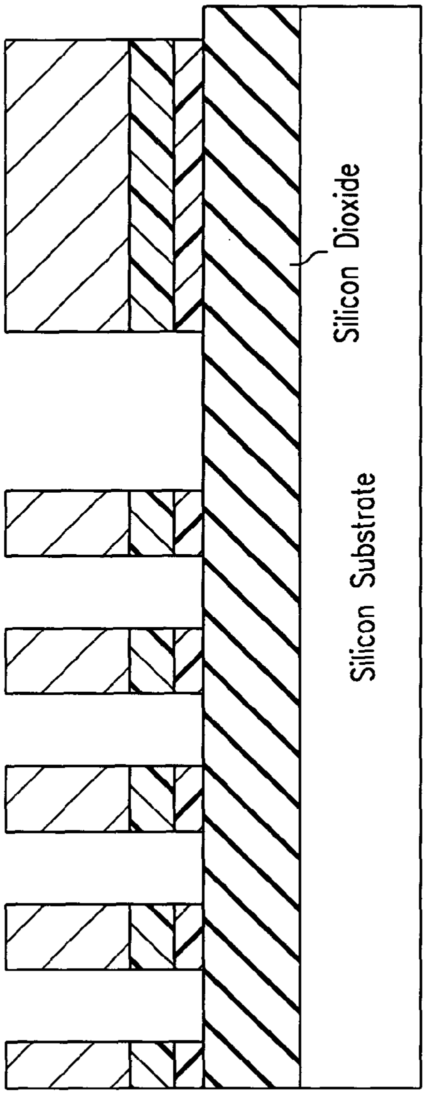
FIG. 6B illustrates a cross section of the structure illustrated in FIG. 6A.
Figure 6A:
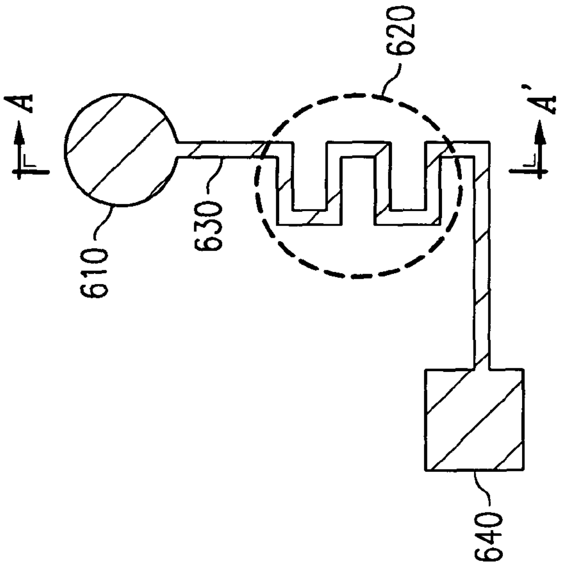
FIG. 6A illustrates a bottom electrode structure in circuit with a thin-film resistor and bond pad in accordance with the present invention.

Subsequent to stack completion, the bottom electrode, first-level interconnects, and the resistor lengths are patterned and the entire metal stack etched 350 (FIG. 3). FIG. 6A illustrates the bottom electrode 610, resistor 620, interconnect 630 and a bond pad 640 which have been patterned and etched, in accordance with the present invention, defining bottom electrode and resistor lengths and FIG. 6B illustrates a cross section view of FIG. 6A through AA. The preferred stack of Al, TiW and NiCr, the Al can be either wet or dry etched while the TiW and NiCr are wet etched in a preferred embodiment.

Figure 7A:
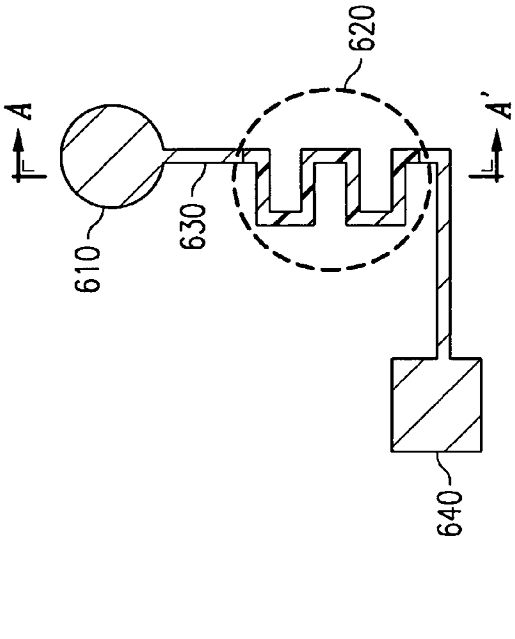
FIG. 7A illustrates a resist pattern of the structure illustrated in FIG. 6A.
Figure 7B:
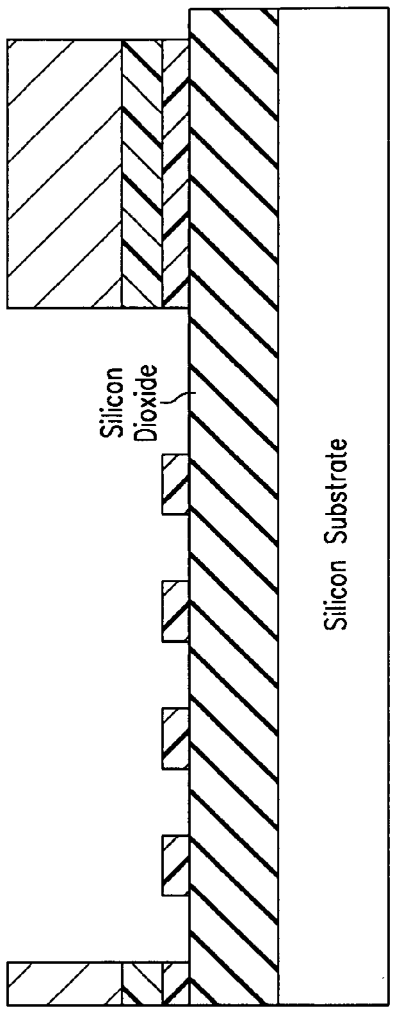
FIG. 7B illustrates a cross section of the structure illustrated in FIG. 7A.

The next step 360 (FIG. 3) is a resist pattern which exposes the resistor to an etch which removes the hard mask materials (e.g. Al and TiW in this case). FIG. 7A illustrates the bottom electrode 610 and resistor 620 after the Al and TiW have been removed and FIG. 7B illustrates a cross section view of FIG. 7A through AA. Note that the bottom electrode is not affected by this second etch step 360 (it is completely covered with resist). At this stage, a primary capacitor dielectric is deposited on the bottom electrode and patterned and etched 370. The primary dielectric is $SiO_2$, $Si_3N_4$ or $Ta_2O_5$, for example, although the use of any suitable dielectric is foreseen.

Figure 8:
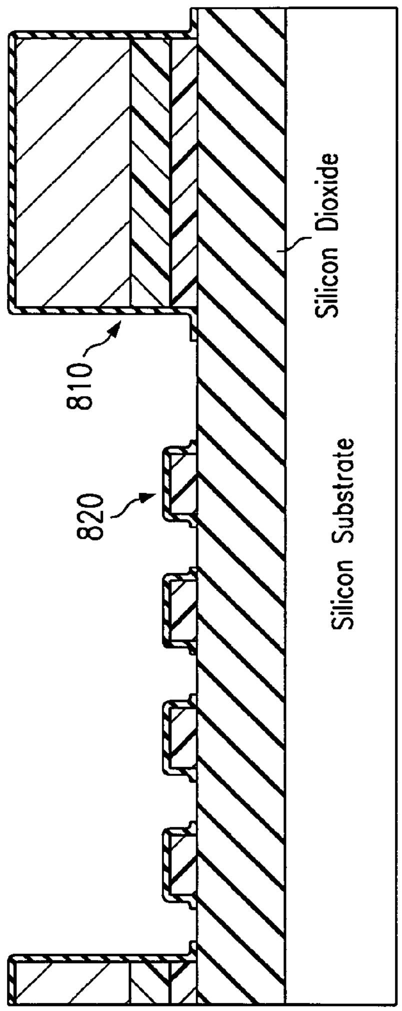
FIG. 8 illustrates the deposit, pattern and etch of a primary dielectric on the structure illustrated in FIG. 7B.

FIG. 8 illustrates the bottom electrode and resistor structure following the dielectric deposit, pattern and etch. Item 810 shows the dielectric covering the bottom electrode and item 820 shows the dielectric covering part of the resistor. It is recommended that the exposed resistor material be encapsulated as soon as possible following the removal of the hard mask material.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A method to form a RF switch by integrating a resistor in circuit with a bottom electrode of a micro-electromechanical switch on a substrate, said method comprising the steps of:

depositing a uniform layer of a resistor material over at least one side of said substrate;

depositing a uniform layer of a hard masked material over said resistor material;

depositing a uniform layer of a metal material over said hard mask material, wherein said deposited layers form a stack;

patterning and etching said bottom electrode of said micro-electromechanical switch and resistor lengths from said stack; and etching said hard mask and metal material from said patterned resistor length to form said RF switch.

2. The RF switch of claim 1, wherein said hard mask and metal material remain substantially covering said patterned bottom electrode subsequent to said etching said hard mask and metal material from said patterned resistor length.

3. The RF switch of claim 2, further comprising the step of depositing a dielectric over said patterned bottom electrode and resistor following said etching of said hard mask and metal material from said patterned resistor length.

4. The RF switch of claim 3, further comprising the step of patterning and etching said deposited dielectric to correspond to said pattern bottom electrode and resistor lengths.

5. The RF switch of claim 3, wherein said act of depositing a dielectric is performed immediately subsequent to etching said hard mask and metal material from said patterned resistor length.

6. The RF switch of claim 1, wherein said substrate comprises a deposited uniform layer of an anchor material comprising $SiO_2$.

7. The RF switch of claim 1 wherein said resistor material comprises NiCr.

8. The RF switch of claim 1, wherein said metal material comprises Al—Si.

9. The RF switch of claim 1, wherein at least one of said etching acts comprises wet etching.

* * * * *

UNITED STATES PATENT AND TRADEMARK OFFICE

CERTIFICATE OF CORRECTION

PATENT NO. : 6,977,196 B1 Page 1 of 1
DATED : December 20, 2005
INVENTOR(S) : Darius L. Crenshaw, Stuart M. Jacobsen and David J. Seymour It is certified that error appears in the above-identified patent and that said Letters Patent is hereby corrected as shown below:

Title page,
Item [62], Related U.S. Application Data, should read -- Division of application No. 09/941,031, filed August 28, 2001, now Patent No. 6,698,082. --.

Signed and Sealed this

Eighteenth Day of April, 2006

JON W. DUDAS
*Director of the United States Patent and Trademark Office*